United States Patent [19]
Nakagawa et al.

[11] Patent Number: 6,083,577
[45] Date of Patent: Jul. 4, 2000

[54] MASK PROTECTIVE DEVICE

[75] Inventors: Hiroaki Nakagawa; Masahiro Kondo, both of Yamaguchi, Japan

[73] Assignee: Mitsui Chemicals, Inc., Tokyo, Japan

[21] Appl. No.: 09/043,272

[22] PCT Filed: Jul. 8, 1997

[86] PCT No.: PCT/JP97/02368

§ 371 Date: Mar. 17, 1998

§ 102(e) Date: Mar. 17, 1998

[87] PCT Pub. No.: WO98/02783

PCT Pub. Date: Jan. 22, 1998

[30]  Foreign Application Priority Data

Jul. 17, 1996 [JP] Japan ................................. 8-187145

[51] Int. Cl.$^7$ ...................................................... G03F 1/14
[52] U.S. Cl. ............................. 428/14; 428/194; 428/203; 430/5
[58] Field of Search ............................. 428/14, 203, 194; 430/5

[56]  References Cited

FOREIGN PATENT DOCUMENTS

WO92/21066  11/1992  WIPO .

*Primary Examiner*—Alexander Thomas
*Attorney, Agent, or Firm*—Sherman and Shalloway

[57] ABSTRACT

In a mask protective device comprising a frame, the size of which is set to surround a mask pattern, and a transparent thin film 12 spread and fixed to the frame to close one opening of the frame, the periphery of the transparent thin film 12 is bonded to an end face 11a at one opening of the frame 11 by adhesives 41 applied on the whole surface of the end face 11a to cover and close the opening of the frame 11.

A string-like bead 42 is formed on an end face 11b at the other end opening of the frame 11 by linearly applying adhesives, for bonding the frame 11 to the mask 17, all around the end face 11b of the frame 11. The string-like bead 42 formed on the end face 11b at the other opening of the frame 11 can be formed helically, formed in two lines arranged inside and outside in parallel with each other which have respective discontinuities at different places to have openings allowing the communication between the inside and the outside the mask protective device, or the like.

As the mask protective device 40 is mounted on the mask 17 and bonded to the mask 17 by the string-like bead 42 made of adhesives linearly applied to the end face 11b of the frame, the top of a curved groove of which side walls are portions of the string-like bead 42 is closed by the mask 17, the groove becomes an air passage 43 allowing the communication between the inside and the outside of the frame 11. Therefore, the inner space 19 of the mask protective device 40 communicates with the outside through the air passage 43 so that air in the mask protective device 40 moves in and out through the air passage 43 even with changes in atmospheric pressure and/or in temperature, thereby preventing the thin film 12 from swelling or denting and preventing the damage of the thin film 12 and trouble on the optical characteristics.

3 Claims, 8 Drawing Sheets

FIG.15

MASK PROTECTIVE DEVICE

CROSS REFERENCE TO RELATED APPLICATION

This application is the National Phase entry under 35 USC 371, of International PCT application PCT/JP97/02368, filed Jul. 8, 1997, and designating the United States.

TECHNICAL FIELD

The present invention relates to a mask protective device for preventing sticking of dust and other particles on a mask or reticle (hereinafter, generically referred to as "mask") which is, for example, used for photolithography in manufacturing processes of an integrated circuit.

BACKGROUND ARTS

One of the manufacturing processes of an integrated circuit is a photolithographic process for transferring a designed layout pattern onto a semiconductor wafer. In this photolithographic process, the pattern printed on a mask is transferred onto the semiconductor wafer using photographic technique.

If dust or other particle sticks on the mask in the photolithographic process, the dust or particle is also projected onto the semiconductor wafer. This may be a cause of producing defectives. In order to solve this problem and to prevent sticking of dust and other particles on the mask, a mask protective device is employed.

A conventional mask protective device comprises a rectangular frame, the size of which is set to surround the layout pattern of the mask, and a transparent thin film which is fixed to the frame around the periphery thereof in such a manner as to close one open end of the frame. The mask protective device is mounted on the mask by bonding the other open end of the frame to the mask with bonding means such as a pressure-sensitive adhesive tape.

When the mask protective device is disposed on and fixed to the mask in this manner, there is a space to be hermetically sealed, of which height corresponds to the height of the frame, between the mask and the transparent thin film disposed on the one open end of the frame of the mask protective device.

When the space i.e. the inside of the mask protective device is hermetically sealed, it sometimes happens that the thin film spread on the frame swells or dents due to changes in atmospheric pressure and/or in temperature. The swell or dent in the thin film may change the optical characteristics of the film and/or, in case of severely swelling or denting, may damage the thin film by that the thin film comes in contact with the mask or a rid of a casing which accommodates the mask and the mask protective device therein.

In order to solve the aforementioned problem, there has been proposed a mask protective device which has a frame provided with at least one vent hole which is closed by a filter to prevent entrance of dust or other particles and to allow the communication between the inside of the mask protective device and the atmosphere. This technique is disclosed in Utility Model Publication No. S63(1988)-39703.

However, the mask protective device in which the frame having the vent hole with the filter has the following problems: (1) the processes for forming the vent hole in the frame, periodically cleaning of the vent hole and the filter, and thus detaching and attaching the filter increase the man-hour in the manufacturing and also in the maintenance, and it is necessary to produce the vent hole and the filter in such a manner as to meet the quality standard; (2) there is a risk of dusting when blowing the filter to clean the filter; and (3) forming the vent hole in the frame loses the strength of the frame, in particular, the larger the number of vent holes and/or the larger the diameter of the hole to improve its permeability, the lower the strength of the frame.

It is an object of the present invention to solve the aforementioned conventional problems and to provide a mask protective device which allows the communication between the inside space and the atmosphere to provide permeability, and into which dust and other particles yet hardly enter.

It is another object of the present invention to provide a mask protective device which allows the communication between the inside space and the atmosphere to provide permeability without losing the strength of the frame, and into which dust and other particles yet hardly enter.

It is still another object of the present invention to provide a mask protective device into which dust and other particles hardly enter without using a filter, and which allows the communication between the inside space and the atmosphere to provide permeability.

DISCLOSURE OF THE INVENTION

The present invention provides a mask protective device which is structured as follows to solve the aforementioned problems of prior art. The present invention provides a mask protective device comprising a frame, the size of which is set to surround a mask pattern, and a transparent thin film fixed to the frame in the spread state to close one opening of the frame. In the mask protective device, a string-like bead is formed all around an end face at one opening of the frame by linearly applying adhesives or pressure-sensitive adhesives for bonding the periphery of the thin film to the end face, and a curved groove is formed on the end face of the frame by portions of said string-like bead facing each other so that the portions of the string-like bead constitute the side walls of the curved groove. The curved groove has one opening communicating with the outside of the mask protective device and the other opening communicating with the inside of the mask protective device. In this connection, when the periphery of the thin film is put on and bonded to the string-like bead, the groove becomes an air passage.

The curved groove may be formed by forming the string-like bead helically along the end face, which is formed by applying adhesives or pressure-sensitive adhesives all around the end face at one opening of the frame.

Further, the curved groove may be formed by applying adhesives or pressure-sensitive adhesives all around the end face at one opening of the frame in such a manner as to form at least two string-like beads, arranged inside and outside on the end face, having respective discontinuities. In this case, the discontinuities are formed in different places on the end face of the frame to form openings of the groove for allowing the communication between the inside of the outside of the frame.

Furthermore, the adhesives or pressure-sensitive adhesives may be applied all around the end face at one opening of the frame to form at least one string-like bead in a single line having a discontinuity. In this case, the curved groove is formed at the discontinuity of the string-like bead so that the curved groove connects the inside and the outside of the mask protective device. When the curved groove is formed at the discontinuity of the string-like bead of a single line, the string-like bead should be wide or should have wide portions around the discontinuity, and one end of the string-like bead is formed in a U-like configuration in the plane and the other end facing the one end is formed in such a configuration as to enter into the inside of the U-like configuration.

Besides this configuration, the two ends of the string-like bead at the discontinuity may be shifted to be arranged in parallel to each other, or may be each formed in a hook-like configuration so that the ends seem to be engaged with each other.

It is also preferable that before applying the adhesives or pressure-sensitive adhesives on the end face at the one opening of the frame to form the string-like bead, adhesives or pressure-sensitive adhesives are previously applied thinly to the end face of the frame to form an adhesive layer or a pressure-sensitive adhesive layer on the bottom face of the curved groove. It is still preferable that adhesives or pressure-sensitive adhesives are previously applied thinly on an inner surface of the periphery of the transparent thin film to be mounted on the string-like bead.

The present invention further provides a mask protective device comprising a frame, the size of which is set to surround a mask pattern, and a transparent thin film mounted on the frame to close one opening of the frame, wherein a string-like bead is formed all around an end face at the other opening of the frame by linearly applying adhesives or pressure-sensitive adhesives for bonding the frame of the mask protective device to a mask surface; and a curved groove is formed on the end face of the frame by portions of said string-like bead facing each other in such a manner that the portions of the string-like bead constitute the side walls of the curved groove, wherein the curved groove has one opening communicating with the outside of the mask protective device and the other opening communicating with the inside of the mask protective device. Therefore, when the mask protective device is mounted on the mask surface, the mask surface comes into contact with the top of the string-like bead so that the groove becomes an air passage.

The curved groove may be formed by forming the string-like bead helically along the end face, which is formed by applying adhesives or pressure-sensitive adhesives all around the end face at the other opening of the frame.

Further, the curved groove may be formed by applying adhesives or pressure-sensitive adhesives all around the end face at the other opening of the frame in such a manner as to form at least two string-like beads, arranged inside and outside on the end face in parallel to each other, having respective discontinuities. In this case, the discontinuities of the inside and outside lines are formed in different places on the end face of the frame to form openings of the groove for allowing the communication between the inside of the outside of the frame.

Furthermore, the adhesives or pressure-sensitive adhesives may be applied all around the end face at the other opening of the frame to form at least one string-like bead in a single line having at least one discontinuity. In this case, the curved groove is formed at the discontinuity of the string-like bead so that the curved groove connects the inside and the outside of the mask protective device.

It is also preferable that before applying the adhesives on the end face at the other opening of the frame to form the string-like bead, adhesives or pressure-sensitive adhesives are previously applied thinly to the end face of the frame to form an adhesive layer or a pressure-sensitive adhesive layer on the bottom face of the curved groove.

The present invention still further provides a mask protective device comprising a frame, the size of which is set to surround a mask pattern, and a transparent thin film mounted on the frame to close one opening of the frame, wherein a first string-like bead is formed all around an end face at one opening of the frame by linearly applying adhesives or pressure-sensitive adhesives for bonding the periphery of the thin film to the end face; a first curved groove is formed on the end face of the frame by portions of said string-like bead facing each other in such a manner that the portions of the first string-like bead constitute the side walls of the first curved groove; a second string-like bead is formed all around an end face at the other opening of the frame by linearly applying adhesives or pressure-sensitive adhesives for bonding the frame of the mask protective device to a mask surface; and a second curved groove is formed on the end face of the frame by portions of said string-like bead facing each other in such a manner that the portions of the second string-like bead constitute the side walls of the second curved groove, wherein each curved groove has one opening communicating with the outside of the mask protective device and the other opening communicating with the inside of the mask protective device. Therefore, when the periphery of the thin film is put on and bonded to the first string-like bead, the first groove becomes an air passage, and when the mask protective device is mounted on the mask surface, the mask surface comes into contact with the top of the second string-like bead so that the second groove becomes another air passage.

The first curved groove may be formed by forming the first string-like bead helically along the end face, which is formed by applying adhesives or pressure-sensitive adhesives all around the end face at one opening of the frame.

Further, the first curved groove may be formed by applying adhesives or pressure-sensitive adhesives all around the end face at one opening of the frame in such a manner as to form at least two first string-like beads, arranged inside and outside on the end face, having respective discontinuities. In this case, the discontinuities of the inside and the outside lines of the first string-like bead are formed in different places on the end face of the frame to form openings of the first groove for allowing the communication between the inside of the outside of the frame.

Furthermore, the adhesives or pressure-sensitive adhesives may be applied all around the end face at one opening of the frame to form at least one first string-like bead in a single line having at least one discontinuity and the first curved groove is formed at the discontinuity of the first string-like bead so that the first curved groove connects the inside and the outside of the mask protective device.

It is preferable that before applying the adhesives or pressure-sensitive adhesives on the end face at one opening of the frame to form the first string-like bead, adhesives or pressure-sensitive adhesives are previously applied thinly to the end face of the frame to form an adhesive layer or a pressure-sensitive adhesive layer on the bottom face of the first curved groove. It is also preferable that adhesives or pressure-sensitive adhesives are previously applied thinly on an inner surface of the periphery of the transparent thin film to be mounted on the first string-like bead and the periphery is put on and bonded to the first string-like bead so as to form an adhesive layer or a pressure-sensitive adhesive layer on the top inner face of the air passage.

In addition, the second curved groove may be formed by forming the second string-like bead helically along the end face, which is formed by applying adhesives or pressure-sensitive adhesives all around the end face at the other opening of the frame.

Further, the second curved groove may be formed by applying adhesives or pressure-sensitive adhesives all around the end face at the other opening of the frame in such a manner as to form at least two second string-like beads, arranged inside and outside on the end face, having respective discontinuities. In this case, the discontinuities of the inside and outside lines of the second string-like bead are formed in different places on the end face of the frame to form openings of the second groove for allowing the communication between the inside of the outside of the frame.

Still further, the adhesives or pressure-sensitive adhesives may be applied all around the end face at the other opening of the frame to form at least one second string-like bead in a single line having at least one discontinuity. In this case, the second curved groove is formed at the discontinuity of the second string-like bead so that the second curved groove connects the inside and the outside of the mask protective device. It is preferable that before applying the adhesives or pressure-sensitive adhesives on the end face at the other opening of the frame to form the second string-like bead, adhesives or pressure-sensitive adhesives are previously applied thinly to the end face of the frame to form an adhesive layer or pressure-sensitive adhesive layer on the bottom face of the second curved groove.

As mentioned above, when the curved grooves are formed by the first and second string-like beads formed on the end faces at one and the other openings of the frame, respectively, it is also preferable that before applying the adhesives or pressure-sensitive adhesives on the end faces of the frame to form the first and second string-like beads, adhesives or pressure-sensitive adhesives are previously applied thinly to the whole surfaces of the respective end faces to form adhesive layers or pressure-sensitive adhesive layers on the bottom faces of the respective curved grooves.

The possible methods of forming such string-like beads as mentioned above on an end face of the frame include a method in which relatively thick adhesives are placed on the frame by using the printing technology, a method in which adhesives are pushed out from a nozzle and linearly placed just like drawing, and a method in which after applying adhesives on the whole surface of the end face of the frame in a predetermined thickness, useless portions of the adhesives are removed by cutting or the like.

In the mask protective devices of the present invention, for example, epoxy acrylate, urethane acrylate, polyester acrylate, and polyethylene acrylate may be employed as adhesives for forming such a string-like bead.

Moreover, for example, polystyrene and materials of which base polymer may be copolymer, polyisobutylene, polyester resin, vinyl acetate resin, ethylene-vinyl acetate copolymer, and polyethylene phenoxy resin may be employed as pressure-sensitive adhesives.

According to the mask protective device of the present invention as mentioned above, when adhesives or pressure-sensitive adhesives for fixing a transparent thin film to one or both of end faces of a frame, the size of which is set to surround a mask pattern, or fixing the frame to a mask surface are applied to form a string-like bead on the end face of the frame, a curved groove of which side walls are portions of the string-like bead is formed in such a manner as to allow the communication between the inside and the outside of the frame. In this connection, as the thin film is mounted on the frame or the mask protective device is fixed to the mask, the top of the curved groove is closed so that the curved groove becomes an air passage.

By the presence of the air passage, the inside of the mask protective device is prevented from being hermetically sealed when it is mounted on the mask, thereby preventing the expansion and contraction of air in the mask protective device due to changes in atmospheric pressure and/or in temperature. Therefore, the thin film spread on the frame is prevented from swelling or denting due to changes in atmospheric pressure and/or in temperature, with the result that the thin film is not damaged and the optical characteristics of the film can be kept well in conformity to the designed level.

BEST MODE FOR CARRYING OUT THE INVENTION

Hereinafter, a mask protective device of the present invention will be described in detail in connection with the embodiments shown in drawings.

[First Embodiment]

Figure 1:
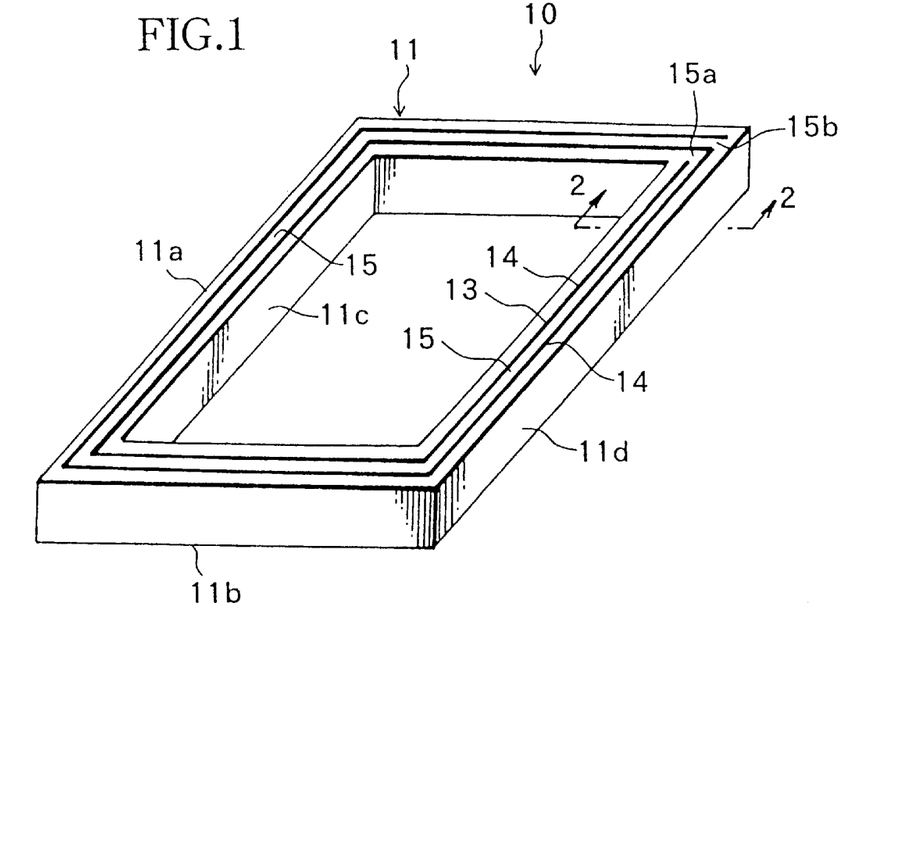
FIG. 1 is a perspective view schematically showing a mask protective device according to a first embodiment of the present invention.

FIG. 1 shows a mask protective device 10 according to the first embodiment of the present invention. The mask protective device 10 is provided with a rectangular frame 11, the size of which is set to surround a mask pattern (not shown). The frame 11 is generally called as "pellicle frame". The frame 11 has facing portions 11a, 11b on open end sides in an opposed relation, respectively. Two openings formed in the frame 11 extend in the same levels of the facing portions 11a, 11b, respectively. The facing portions 11a, 11b will be referred to as "end faces" for convenience. Besides two end faces 11a and 11b, the frame 11 comprises an inner face 11c and outer face 11d.

Figure 2:
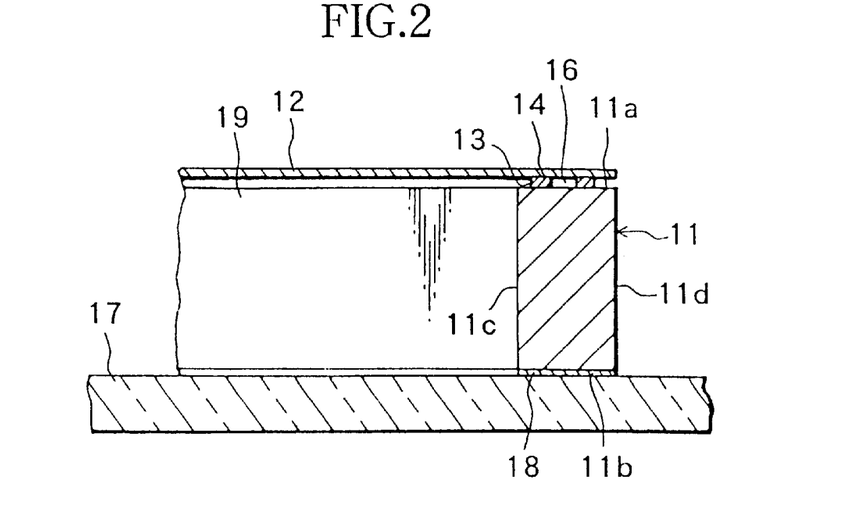
FIG. 2 is a partially sectional view showing the mask protective device of the first embodiment, taken along line 2—2 of FIG. 1.

The periphery of a transparent thin film 12 is bonded on one end face 11a of the frame 11 by adhesives 13 applied on the end face 11a in such a manner as to cover the opening as shown in FIG. 2. The transparent thin film 12 is generally called as "pellicle film". The adhesives 13 are linearly applied on the end face 11a of the frame 11 from the vicinity of one corner thereof along the end face 11a. After coming full circle on the frame, the adhesives 13 are further applied in parallel with the linear adhesives already applied to keep equal spaces therefrom. After coming another full circle, the application of the adhesives 13 is finished at the corner i.e. the starting point. Accordingly, the linear of the adhesives 13 is helically formed in two circles on the end face 11a of the frame 11.

Figure 3:
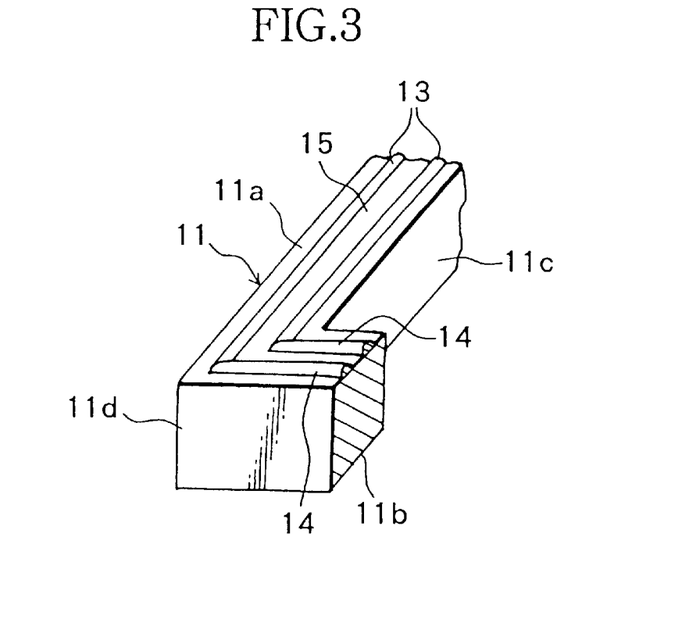
FIG. 3 is a partial perspective view showing a frame of the mask protective device of the first embodiment shown in FIG. 1, illustrating a string-like bead formed on an end face of the frame by adhesives.

The adhesives 13 applied linearly in this manner swell to form string-like bead 14 protuberant from the end face 11a of the frame 11 as shown in FIG. 3. As a result of this, formed on the end face of the frame 11 is a groove 15 of which side walls are two lines of the bead 14 which are spaced from each other. The groove 15 is curved along the end face 11a of the frame 11 and has one opening 15a communicating with the inside of the frame 11 and the other opening 15b communicating with the outside of the frame 11.

After setting the transparent thin film 12 in such a position as to close the one opening of the frame 11, the periphery of the transparent thin film 12 is put on and bonded to the helical string-like bead 14 which is made of the adhesives 13 linearly applied on the end face 11a of the frame 11. In this connection, since the top of the groove 15 formed between the lines of the string-like bead 14 is closed, the groove 15 becomes an air passage 16 allowing the communication between the inside and the outside of the frame 11.

The mask protective device 10 is disposed on the surface of the mask 17 as shown in FIG. 2 and is fixed to the surface of the mask 17 by pressure-sensitive adhesives 18a applied all around the end face 11b at the other opening of the frame 11. Therefore, since the inner space 19 of the mask protective device 10 communicates with the outside through the air passage 16 so that air in the mask protective device 10 moves in and out through the air passage 16, the thin film 12 neither swells nor dents even with changes in atmospheric pressure and/or in temperature and the optical characteristics of the film is thus never affected.

Even when air moves in and out of the mask protective device, dust and other particles intending to enter with air flow can not reach the inside of the mask protective device because the air passage is curved and the side walls of the air passage are made of adhesives, thereby preventing the entrance of dust and other particles.

Figure 4:
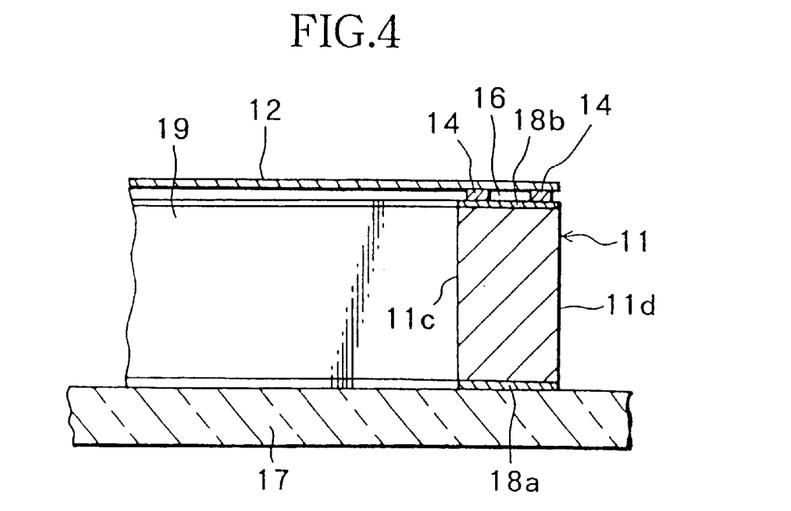
FIG. 4 is a partially sectional view similar to FIG. 2, showing an alternative of the mask protective device of the first embodiment shown in FIG. 1.

As an alternative of the mask protective device 10 according to the first embodiment, before applying the adhesives 13 on the end face 11a at the one opening of the frame to form the string-like bead 14, pressure-sensitive adhesives 18b are previously applied thinly to the whole surface of the end face 11a of the frame 11 to form a pressure-sensitive adhesive layer on the bottom face of the curved groove 15. It is preferable because the pressure-sensitive adhesive layer improves the efficiency of trapping foreign matter intending to enter into the mask protective device 10 through the air passage 16.

Though the pressure-sensitive adhesives 18b are applied to the whole surface of the end face 11a in the example shown in FIG. 4, it is enough to apply the pressure-sensitive adhesives to only such a range as to form the pressure-sensitive adhesive layer on the bottom face of the groove 15.

Figure 5:
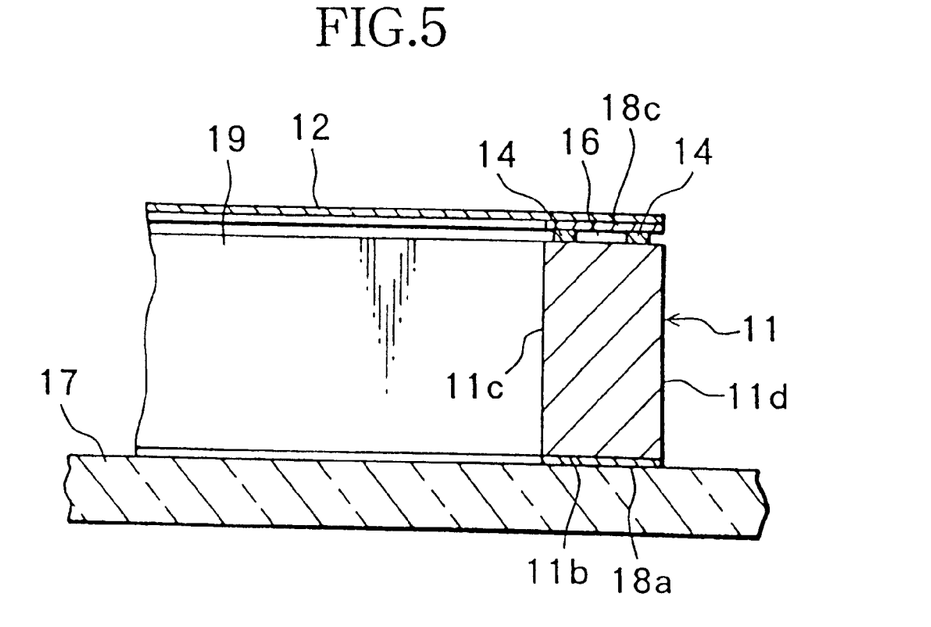
FIG. 5 is a partially sectional view similar to FIG. 2, showing another alternative of the mask protective device of the first embodiment shown in FIG. 1.

As another alternative of the mask protective device 10 according to the first embodiment, pressure-sensitive adhesives 18c are previously applied thinly to an inner surface of the periphery of the transparent thin film 12 to be put on the string-like bead 14 and the periphery with the pressure-sensitive adhesives 18c is put on and bonded to the string-like bead 14 so as to form a pressure-sensitive adhesive layer on the top inner face of the air passage 16, thereby improving the efficiency of trapping foreign matter intending to enter into the mask protective device 10 through the air passage 16.

In this case also, it is enough to apply the pressure-sensitive adhesives 18c to only such a range as to form the pressure-sensitive adhesive layer on the top inner face of the air passage 16.

In addition, in the combination of these alternatives of FIG. 4 and FIG. 5, the air passage 16 of which side walls are the string-like bead 14 formed on the end face 11a of the frame 11 may have pressure-sensitive adhesive layers on both the bottom face and the top inner face thereof. Accordingly, further improvement in the trapping efficiency can be expected.

[Second Embodiment]

Figure 6:
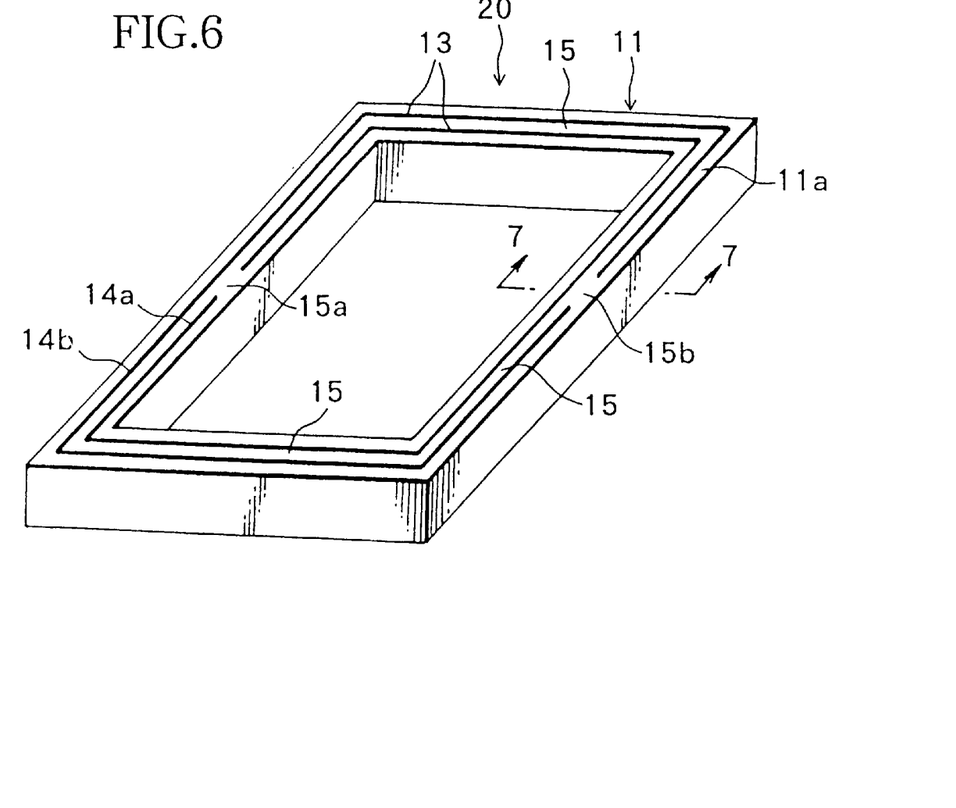
FIG. 6 is a perspective view schematically showing a mask protective device according to a second embodiment of the present invention.
Figure 7:
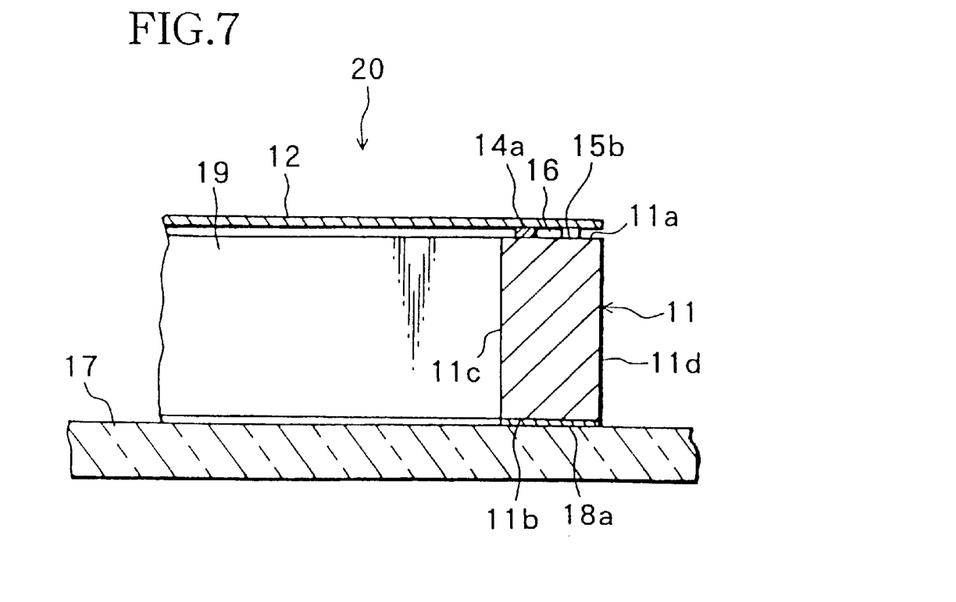
FIG. 7 is a partially sectional view showing the mask protective device of the second embodiment, taken along line 7—7 of FIG. 6.

FIG. 6 and FIG. 7 show a mask protective device 20 according to the second embodiment of the present invention. The mask protective device 20 according to the second embodiment comprises inner and outer string-like beads 14a, 14b spaced from each other extending all around the end face 11a at one opening of the frame 11. Therefore, a groove 15 formed between the inner and outer string-like beads 14a, 14b extends in the longitudinal direction and is curved on the end face 11a of the frame 11. Similar to the first embodiment, the string-like beads 14a, 14b are formed by linearly applying adhesives 13 and the periphery of a transparent thin film 12 is put on and bonded to the string-like beads 14a, 14b.

Neither the inner string-like bead 14a nor the outer string-like bead 14b is formed in a complete circle and both are each formed in a circle having at least one break. That is, the string-like beads 14a, 14b are each formed in a discontinuous circle, i.e. a line. The discontinuities i.e. breaks 15a, 15b are formed in different places on the end face 11a of the frame 11 so that the discontinuities 15a, 15b form openings of the curved groove 15 for communicating with the inside and the outside of the frame 11.

The transparent thin film 12 is disposed in such a manner as to close one opening of the frame 11 and the periphery of the thin film 12 is put on and bonded to the inner and outer discontinuous string-like beads 14a, 14b formed by applying the adhesives 13 on the end face 11a of the frame 11. In this connection, since the top of the curved groove 15 formed between of the string-like beads 14a, 14b is closed, the groove 15 becomes an air passage 16 allowing the communication between the inside and the outside of the frame 11.

The mask protective device 20 according to the second embodiment is disposed on the surface of the mask 17 as shown in FIG. 7 and is fixed to the surface of the mask 17 by pressure-sensitive adhesives 18a applied all around the end face 11b at the other opening of the frame 11. Therefore, since the inner space 19 of the mask protective device 20 communicates with the outside through the air passage 16 so that air in the mask protective device 20 moves in and out through the air passage 16, the thin film 12 neither swells nor dents even with changes in atmospheric pressure and/or in temperature and the optical characteristics of the film is thus never affected.

Even when air moves in and out of the mask protective device, dust and other particles intending to enter with air flow can not reach the inside of the mask protective device because the air passage is curved and the side walls of the air passage are made of adhesives, thereby preventing the entrance of dust and other particles.

Figure 8:
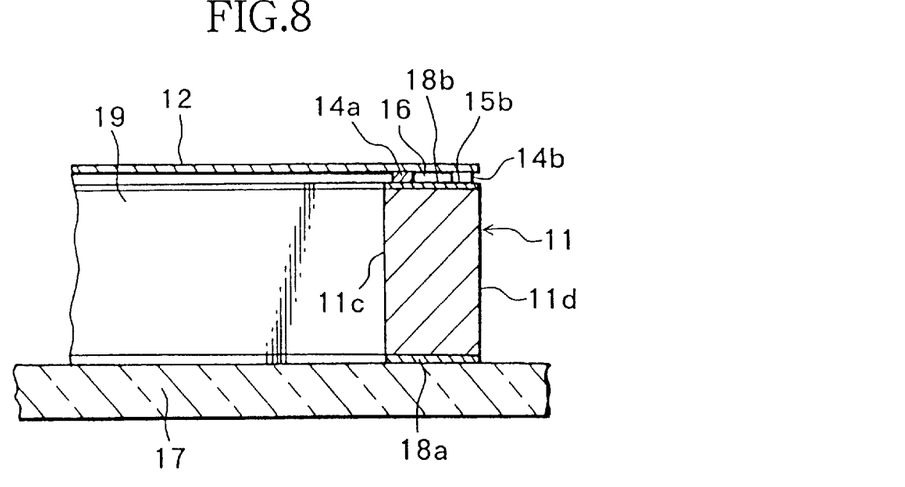
FIG. 8 is a partially sectional view similar to FIG. 7, showing an alternative of the mask protective device of the second embodiment shown in FIG. 6.

As an alternative of the mask protective device 20 according to the second embodiment, before applying the adhesives 13 on the end face 11a at the one opening of the frame 11 to form the string-like beads 14a, 14b, pressure-sensitive adhesives 18b are previously applied thinly to the whole surface of the end face 11a of the frame 11 to form a pressure-sensitive adhesive layer on the bottom face of the curved groove 15. It is preferable because the pressure-sensitive adhesive layer improves the efficiency of trapping foreign matter intending to enter into the mask protective device 20 through the air passage 16. It should be understood that it is also enough to apply the pressure-sensitive adhesives to only such a range as to form the pressure-sensitive adhesive layer on the bottom face of the air passage 16.

Figure 9:
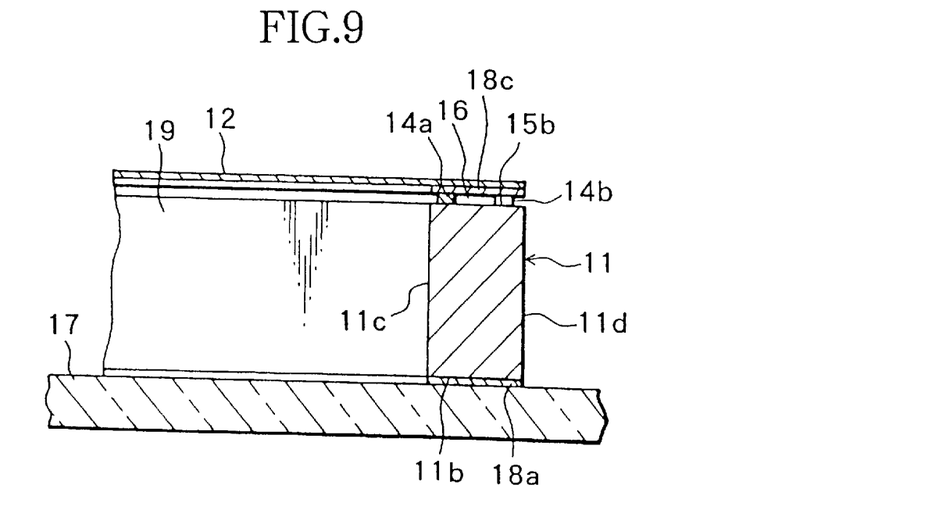
FIG. 9 is a partially sectional view similar to FIG. 7, showing another alternative of the mask protective device of the second embodiment shown in FIG. 6.

As another alternative of the mask protective device 20 according to the second embodiment, pressure-sensitive adhesives 18c are previously applied thinly to an inner peripheral surface of the transparent thin film 12 to be put on the string-like beads 14a, 14b and the periphery with the pressure-sensitive adhesives 18c thereof is put on and bonded to the string-like beads 14a, 14b so as to form a pressure-sensitive adhesive layer on the top inner face of the air passage 16, thereby improving the efficiency of trapping foreign matter intending to enter into the mask protective device 20 through the air passage 16. In this case also, it is enough to apply the pressure-sensitive adhesives 18c to only such a range as to form the pressure-sensitive adhesive layer on the top inner face of the air passage 16.

In addition, in the combination of these alternatives of FIG. 8 and FIG. 9, the air passage 16 of which side walls are the string-like beads formed on the end face 11a of the frame 11 may have pressure-sensitive adhesive layers on both the bottom face and the top inner face thereof. Accordingly, further improvement in the trapping efficiency can be expected.

[Third Embodiment]

Figure 10:
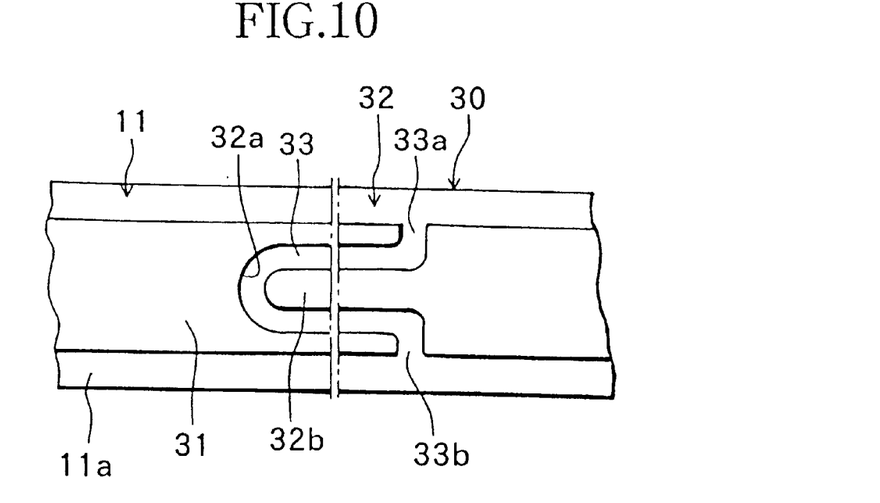
FIG. 10 is a partial plan view showing a discontinuous portion of a wide leaner bead formed on an end face of a frame in a mask protective device according to a third embodiment of the present invention.

FIG. 10 shows a part of a frame 11 in a mask protective device 30 according to the third embodiment of the present invention. The mask protective device 30 of this embodiment comprises a relatively wide string-like bead 31 formed in a single line in the width direction all around the end face 11a of the frame 11 by applying adhesives 13. The string-like bead 31 has at least one discontinuity. The discontinuity 32 is formed as follows.

As shown in FIG. 10, at the discontinuity 32, a recess 32a is formed to dent just like a bay in one end of the string-like bead 31 along the center line thereof and a tail portion 32b is formed to project just like a peninsula on the other end facing the one end in such a manner that the width of the recess 32a is greater than that of the tail portion 32b. The tail portion 32b on the other end of the string-like bead 31 is entered into the recess 32a without any contact between the outer surface of the tail portion 32b and the inner surface of the recess 32a as shown in FIG. 10.

There is therefore a U-shaped curved groove 33 between the inner surface of the recess 32a and the outer surface of the tail portion 32b, of which one end 33a communicates with the inside of the frame 11 and the other end 33b communicates with the outside of the frame 11.

After setting a transparent thin film 12 in such a position as to close the one opening of the frame 11, the periphery of the transparent thin film 12 is put on and bonded to the wide string-like bead 31 which is made of the adhesives 13 linearly applied on the end face 11a of the frame 11. In this connection, since the top of the curved groove 33 formed at the discontinuity 32 of the string-like bead 31 is closed, the groove 33 becomes an air passage allowing the communication between the inside and the outside of the frame 11 through the both ends 33a, 33b.

Just like the first embodiment, the mask protective device 30 according to the third embodiment is also disposed on the surface of the mask 17 and is fixed to the surface of the mask 17 by pressure-sensitive adhesives applied all around the end face 11b at the other opening of the frame 11. Therefore, since the inner space of the mask protective device 30 communicates with the outside through the air passage so that air in the mask protective device 30 moves in and out through the air passage, the thin film 12 neither swells nor dents even with changes in atmospheric pressure and/or in temperature and the optical characteristics of the film is thus never affected.

Even when air moves in and out of the mask protective device, dust and other particles intending to enter with air flow can not reach the inside of the mask protective device because the air passage is curved and the side walls of the air passage are made of adhesives, thereby preventing the entrance of dust and other particles.

Figure 11:
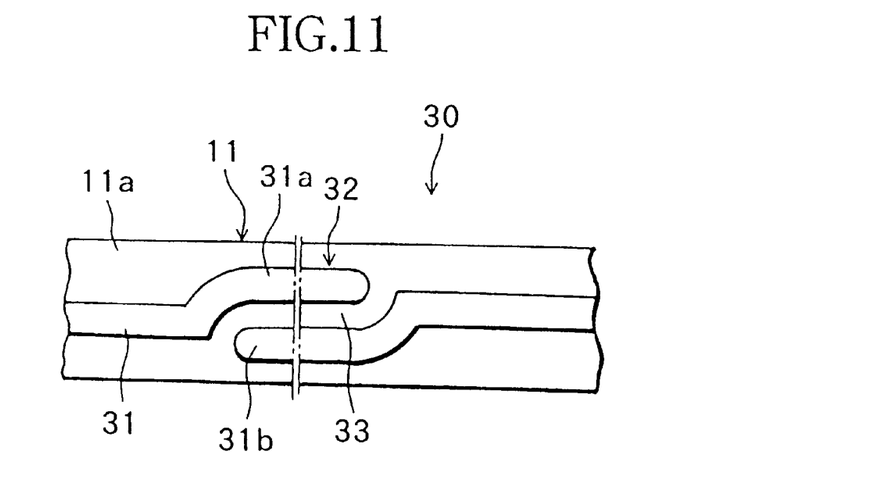
FIG. 11 is a partial plan view similar to FIG. 10, showing an alternative of the mask protective device of the third embodiment shown in FIG. 10.
Figure 12:
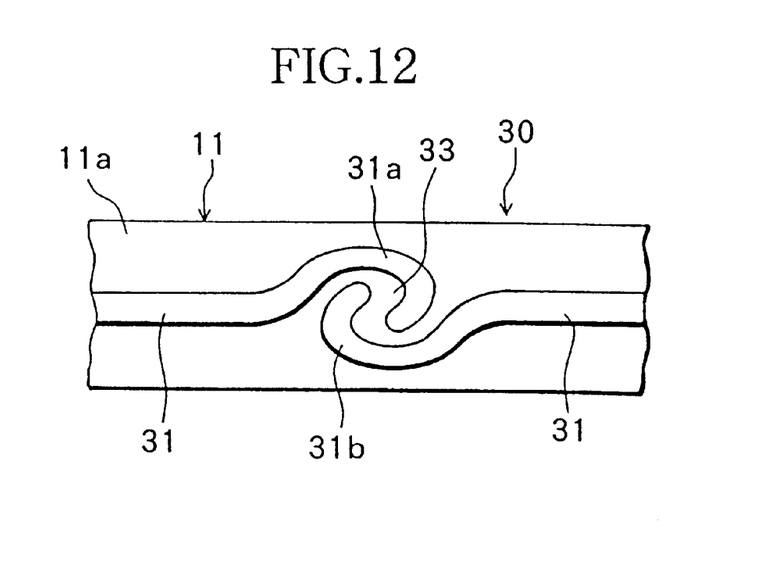
FIG. 12 is a partial plan view similar to FIG. 10, showing another alternative of the mask protective device of the third embodiment shown in FIG. 10.

As the mask protective device 30 according to the third embodiment, the discontinuity 32 with the curved groove 33 crossing the wide string-like bead 31 in the direction of connecting the inside and the outside of the frame 11 may be designed in a large variety of configurations. As one of such configurations, the end portions 31a, 31b of the string-like bead 31 are shifted from the main track and arranged in parallel with each other in predetermined length so as to form a groove 33 as shown in FIG. 11. As an alternative, the end portions 31a, 31b of the string-like bead 31 may be each formed in a hook-like configuration so that the end portions 31a, 31b seem to be engaged with each other so as to form a groove 33 as shown in FIG. 12.

As an alternative of the mask protective device 30 according to the third embodiment, before applying the adhesives 13 on the end face 11a at the one opening of the frame 11 to form the string-like bead 31, pressure-sensitive adhesives are previously applied thinly to the whole surface of the end face 11a of the frame 11 to form a pressure-sensitive adhesive layer at least on the bottom face of the curved groove 33. It is preferable because the pressure-sensitive adhesive layer improves the efficiency of trapping foreign matter intending to enter into the mask protective device 30 through the air passage 16. It should be understood that the pressure-sensitive adhesives are not necessarily applied all around the end face 11a and it is enough to apply the pressure-sensitive adhesives to only a range where the discontinuity 32 of the string-like bead 31 extend.

Just like the alternative of the first embodiment shown in FIG. 5 or the alternative of the second embodiment shown in FIG. 9, pressure-sensitive adhesives may be previously applied thinly to an inner peripheral surface of the transparent thin film 12 to be put on the string-like bead 31 and the periphery thereof is put on and bonded to the string-like bead 31 so as to form a pressure-sensitive adhesive layer on the top inner face of the air passage, thereby improving the efficiency of trapping foreign matter intending to enter into the mask protective device 30 through the air passage.

In this case also, in the combination of these alternatives, the air passage of which side walls are portions of the string-like bead 31 formed on the end face 11a of the frame 11 may have pressure-sensitive adhesive layers on both the bottom face and the top inner face thereof. Accordingly, further improvement in the trapping efficiency can be expected.

[Fourth Embodiment]

Figure 13:
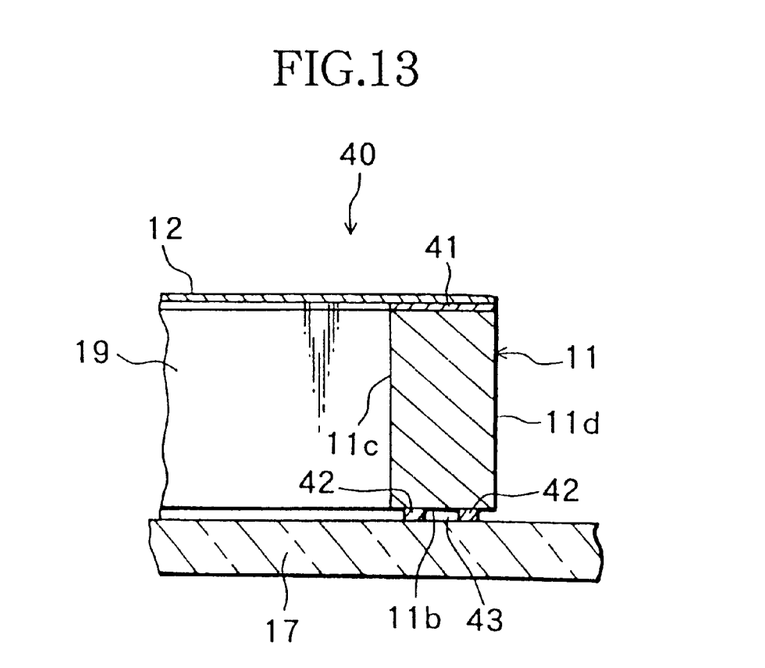
FIG. 13 is a partially sectional view similar to FIG. 7, schematically showing a mask protective device according to a fourth embodiment of the present invention.

FIG. 13 partially shows a mask protective device 40 according to the fourth embodiment of the present invention. In the mask protective device 40 of this embodiment, the periphery of a transparent thin film 12 is bonded to an end face 11a at one opening of a frame 11 by adhesives 41 applied on the whole surface of the end face 11a in such a manner that the transparent thin film 12 closes the opening of the frame 11.

On the other hand, adhesives for bonding the frame 11 to the mask 17 are applied all around an end face 11b at the other opening of the frame 11 in such a manner as to form a string-like bead 42. In this case, the string-like bead 42 formed on the end face 11b at the other opening of the frame 11 may be formed in a helical shape just like the first embodiment shown in FIG. 1. The string-like bead 42 may also be formed in two lines arranged inside and outside in parallel with each other in such a manner as to have respective discontinuities in different places so that the discontinuities become openings of a groove for communicating with the inside and the outside of the frame 11 just like the second embodiment as shown in FIG. 6.

Just like the third embodiment as shown in FIG. 10, FIG. 11, and FIG. 12, in this fourth embodiment, one string-like bead 42 is formed in a single line in the width direction all around the end face 11b of the frame 11 by applying adhesives in such a manner as to have at least one discontinuity. A curved groove can be formed at the discontinuity to cross the wide string-like bead 42 in the direction of connecting the inside and the outside of the frame 11.

The mask protective device 40 is mounted on the surface of the mask 17 as shown in FIG. 13 and bonded to the mask 17 by the string-like bead 42 formed by applying the adhesives 13 on the end face 11b of the frame 11. In this connection, since the top of the curved groove of which side walls are portions of the string-like bead 42 is closed by the mask 17, the groove becomes an air passage 43 allowing the communication between the inside and the outside of the frame 11. Therefore, since the inner space 19 of the mask protective device 40 communicates with the outside through the air passage 43 so that air in the mask protective device 40 moves in and out through the air passage 43, the thin film 12 neither swells nor dents even with changes in atmospheric pressure and/or in temperature and the optical characteristics of the film is thus never affected.

Even when air moves in and out of the mask protective device, dust and other particles intending to enter with air flow can not reach the inside of the mask protective device 40 because the air passage is curved and the side walls of the air passage are made of adhesives, thereby preventing the entrance of dust and other particles.

Figure 14:
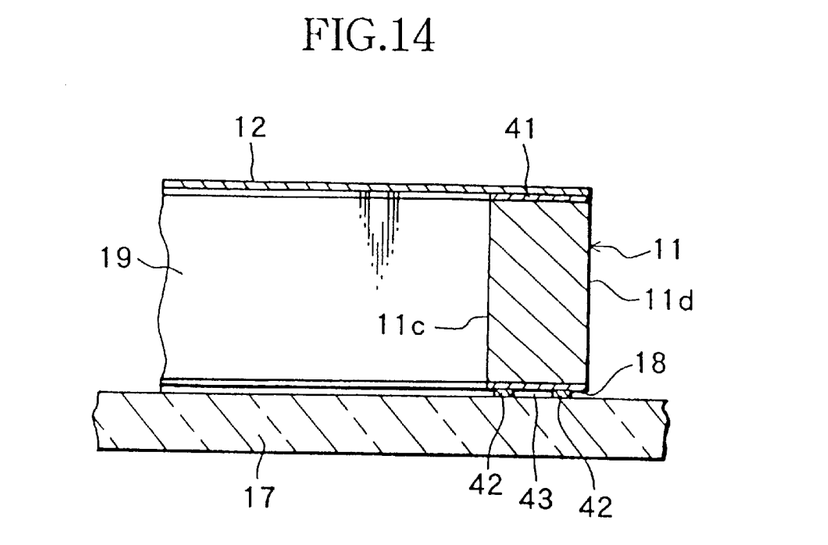
FIG. 14 is a partially sectional view similar to FIG. 13, showing an alternative of the mask protective device of the fourth embodiment shown in FIG. 13.

As an alternative of the mask protective device 40 according to the fourth embodiment, before applying the adhesives 13 on the end face 11b at the other opening of the frame 11 to form the string-like bead 42, pressure-sensitive adhesives 18 are previously applied thinly to the end face 11b of the frame 11 to form a pressure-sensitive adhesive layer at least on the bottom face of the curved groove 43. It is preferable because the pressure-sensitive adhesive layer improves the efficiency of trapping foreign matter intending to enter into the mask protective device 40 through the air passage 43.

By the way, the mask protective device 40 according to the fourth embodiment or the alternative of the present invention as shown in FIG. 13 and FIG. 14 is a best mode for carrying out this invention in actual practice. The reasons are as follows. Dusts adhering on the pellicle film 12 are normally removed by blowing, whereby the pellicle film 12 oscillates. There is a possibility that the pellicle film 12 comes off the frame 11 if the bonding strength between the pellicle film 12 and the pellicle frame (frame 11).

However, in the mask protective device 40 according to the embodiment shown in FIG. 13 and FIG. 14, the string-like bead is formed on a portion of the frame 11 to be in contact with the reticle i.e. mask 17 so that the pellicle film 12 can securely bonded to the end face of the frame 11 by the adhesives 41. Therefore, even when dusts adhering on the pellicle film 12 are removed by blowing, the pellicle film 12 never comes off the frame 11.

[Fifth Embodiment]

Figure 15:
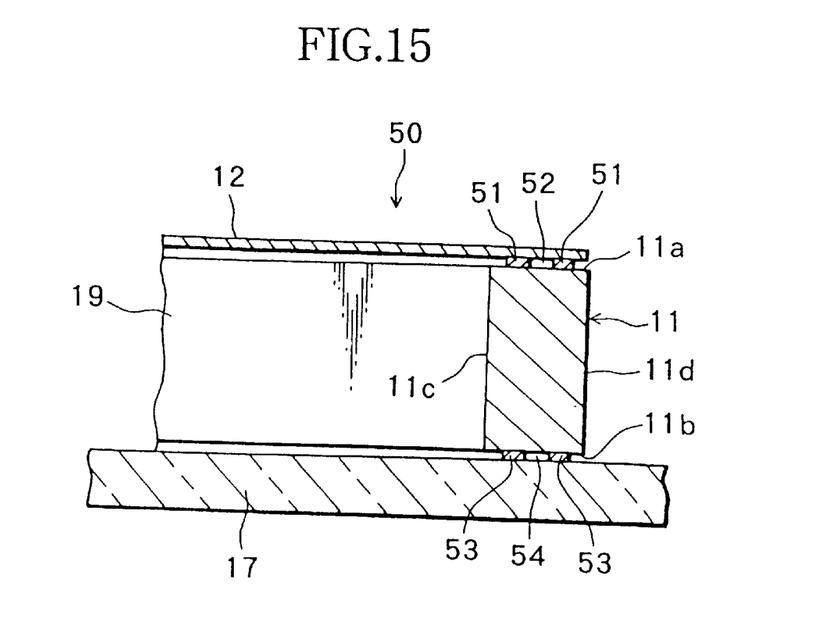
FIG. 15 is a partially sectional view similar to FIG. 7, schematically showing a mask protective device according to a fifth embodiment of the present invention.

FIG. 15 partially shows a mask protective device 50 according to the fifth embodiment of the present invention. The mask protective device 50 of this embodiment is a combination of the first embodiment and the fourth embodiment.

That is, a first string-like bead 51 is formed on the end face 11a at one opening of the frame 11 by applying adhesives all around the end face 11a. A transparent thin film 12 is disposed to close the one opening of the frame 11 and the periphery of the thin film 12 is bonded to the first string-like bead 51 applied on the end face 11a of the frame 11 in such a manner that the thin film 12 is spread. As the thin film 12 is put on and bonded to the first string-like bead 51 as mentioned above, a curved groove formed between lines of the first string-like bead 51 becomes a air passage 52 allowing the communication between the inside and the outside of the frame 11 because the top of the curved groove is closed by the thin film. On the other hand, adhesives for bonding the frame 11 to the mask are also applied all around the end face 11b at the other opening of the frame 11, thereby forming a second string-like bead 53 by the adhesives.

The mask protective device 50 is mounted on the surface of the mask 17 as shown in FIG. 9 and bonded to the mask 17 by the second string-like bead 53 formed by linearly applying the adhesives on the end face 11b of the frame 11. In this connection, since the top of the curved groove of which side walls are portions of the string-like bead 53 is closed by the mask 17, the groove becomes an air passage 54 allowing the communication between the inside and the outside of the frame 11. Therefore, since the inner space 19 of the mask protective device 50 communicates with the outside through the air passages 52, 54 so that air in the mask protective device 50 moves in and out through the air passages 52 54, the thin film 12 neither swells nor dents even with changes in atmospheric pressure and/or in temperature and the optical characteristics of the film is thus never affected.

Even when air moves in and out of the mask protective device, dust and other particles intending to enter with air flow can not reach the inside of the mask protective device 50 because the air passages are curved and the side walls of the air passages are made of adhesives, thereby preventing the entrance of dust and other particles.

In the mask protective device 50 according to the fifth embodiment, the string-like beads 51, 53 formed on the end faces 11a, 11b at both the openings of the frame 11 may be formed in helical shape just like the first embodiment shown in FIG. 1. The string-like beads 51, 53 may also be formed in two lines arranged inside and outside in parallel with each other in such a manner as to have respective discontinuities in different places so that the discontinuities become openings of a groove for communicating with the inside and the outside of the frame 11 just like the second embodiment as shown in FIG. 6.

In addition, just like the third embodiment as shown in FIG. 10, FIG. 11, and FIG. 12, in this fifth embodiment, string-like beads 51, 53 may be each formed in a single line in the width direction all around the end face 11a, 11b of the frame 11 by applying adhesives in such a manner as to each have at least one discontinuity. Curved grooves can be formed at the discontinuities to cross the wide string-like beads 51, 53, respectively, in the direction of connecting the inside and the outside of the frame 11.

As an alternative of the mask protective device 50 according to the fifth embodiment, not shown and just like the alternative of the first embodiment shown in FIG. 4, before applying the adhesives 13 on the end face 11a at the one opening of the frame 11 to form the string-like bead 51, pressure-sensitive adhesives are previously applied thinly to the end face 11a of the frame 11 to form a pressure-sensitive adhesive layer at least on the bottom face of the air passage 52. It is preferable because the pressure-sensitive adhesive layer improves the efficiency of trapping foreign matter intending to enter into the mask protective device 50 through the air passage 52.

As another alternative of the mask protective device 50 according to the fifth embodiment, not shown and just like the alternative of the first embodiment shown in FIG. 5, pressure-sensitive adhesives are previously applied thinly to an inner peripheral surface of the transparent thin film 12 to be put on the string-like bead 51 and the periphery thereof is put on and bonded to the string-like bead 51 so as to form a pressure-sensitive adhesive layer on the top inner face of the air passage 52, thereby improving the efficiency of trapping foreign matter intending to enter into the mask protective device 50 through the air passage 52.

In addition, similarly to the alternative of the fourth embodiment shown in FIG. 14, before linearly applying the adhesives on the end face 11b at the other opening of the frame 11 to form the string-like bead 53, pressure-sensitive adhesives are previously applied thinly to the end face 11b of the frame 11 to form a pressure-sensitive adhesive layer at least on the bottom face of the air passage 54. It is preferable because the pressure-sensitive adhesive layer improves the efficiency of trapping foreign matter intending to enter into the mask protective device 50 through the air passage 54.

In also the mask protective device 50 of course, in the combination of these alternatives, the air passages of which side walls are the string-like beads 51, 53 formed on the end faces 11a, 11b of the frame 11 may have pressure-sensitive adhesive layers on both the bottom faces and the top inner faces thereof. Accordingly, further improvement in the trapping efficiency can be expected.

The possible methods of forming such string-like beads as mentioned above on an end face of the frame in the mask protective device include a method in which relatively thick adhesives are placed on the frame by using the printing technology, a method in which adhesives are pushed out from a nozzle and linearly placed just like drawing, and a method in which after applying adhesives on the whole surface of the end face of the frame in a predetermined thickness, useless portions of the adhesives are removed by cutting or the like.

In the mask protective devices of the aforementioned embodiments, for example, epoxy acrylate, urethane acrylate, polyester acrylate, and polyethylene acrylate may be employed as adhesives for forming such a string-like bead.

Moreover, for example, polystyrene and materials of which base polymer may be copolymer, polyisobutylene, polyester resin, vinyl acetate resin, ethylene-vinyl acetate copolymer, and polyethylene phenoxy resin may be employed as pressure-sensitive adhesives for forming the pressure-sensitive adhesive layer on the bottom of the curved groove and for fixing the frame to the mask.

Normally, pressure-sensitive adhesive refers to material capable of bonding only with slight pressure without the aid of heat or catalyst. On the other hand, adhesive refers to material (Monomer and Pre-polymer type adhesive) which hardens by chemical reaction such as polymerization, condensation, and the like, material (solution and emulsion type adhesive) which hardens by vaporization of solvent or dispersion medium, and material (hot-melt adhesive) which hardens by cooling. The hardening of these materials results from forces of drawing mutually between molecules of adhesive and molecules of adherent.

Though the string-like bead is formed by adhesives in the aforementioned embodiments, the same effect can be obtained with pressure-sensitive adhesives instead of the adhesives. Though the pressure-sensitive adhesives are applied on the end face of the frame or the periphery of the transparent thin film in order to form the pressure-sensitive adhesive layer on the bottom face or the top inner face of the air passage in the above embodiments, adhesives may be employed instead of the pressure-sensitive adhesives.

As described above, according to the mask protective device of the present invention, when adhesives or pressure-sensitive adhesives for fixing a transparent thin film to one or both of end faces of a frame, the size of which is set to surround a mask pattern, or fixing the frame to a mask surface are applied to form a string-like bead on the end face of the frame, a curved groove of which side walls are portions of the string-like bead is formed in such a manner as to allow the communication between the inside and the outside of the frame. In this connection, as the thin film is put on the frame or the mask protective device is fixed to the mask, the top of the curved groove is closed so that the curved groove becomes an air passage. By the presence of the air passage, the inside of the mask protective device is prevented from being hermetically sealed when it is mounted on the mask, thereby preventing the expansion and contraction of air in the mask protective device due to changes in atmospheric pressure and/or in temperature. Therefore, the thin film spread on the frame is prevented from swelling or denting due to changes in atmospheric pressure and/or in temperature with the result that the thin film is not damaged and the optical characteristics of the film can be kept well in conformity to the designed level.

Industrial Applicability

The present invention is effective as a cover for guarding a mask or reticle, which is used for photolithography in manufacturing processes of an integrated circuit, from dust and other particles.

We claim:

1. A mask protective device comprising a frame, the size of which is set to surround a mask pattern, and a transparent thin film put on said frame to close one opening of said frame, said mask protective device further comprising:

string-like beading which is formed all around an end face at the other opening of said frame by linearly applying adhesives or pressure-sensitive adhesives for bonding said frame of said mask protective device to a mask surface; and a curved groove formed on the end face of said frame by portions of said string-like beading facing each other in such a manner that said portions of said string-like beading constitute the side walls of said curved groove, wherein said curved groove has one opening communicating with the outside of said mask protective device and the other opening communicating with the inside of said mask protective device, and when said mask protective device is mounted on said mask surface, the mask surface comes into contact with the top of said string-like beading so that said groove becomes an air passage;

wherein said curved groove is formed by applying adhesives or pressure-sensitive adhesives all around the end face at the other opening of said frame in such a manner as to form said string-like beading as at least two string-like beads, arranged inside and outside on the end face, having respective discontinuities which are formed in different places on the end face of said frame to form openings of said groove for allowing communication between the inside and the outside of said frame.

2. A mask protective device comprising a frame, the size of which is set to surround a mask pattern, and a transparent thin film put on said frame to close one opening of said frame, said mask protective device further comprising:

first string-like beading which is formed all around an end face at one opening of said frame by linearly applying adhesives or pressure-sensitive adhesives for bonding the periphery of said thin film to the end face; a first curved groove formed on the end face of said frame by portions of said first string-like beading facing each other in such a manner that said portions of said first string-like beading constitute the side walls of said first curved groove;

second string-like beading which is formed all around an end face at the other opening of said frame by linearly applying adhesives or pressure-sensitive adhesives for bonding said frame of said mask protective device to a mask surface; a second curved groove formed on the end face of said frame by portions of said second string-like beading facing each other in such a manner that said portions of said second string-like beading constitute the side walls of said second curved groove;

wherein each said curved groove has one opening communicating with the outside of said mask protective device and the other opening communicating with the inside of said mask protective device;

wherein when the periphery of said thin film is put on and bonded to said first string-like beading, said first groove becomes an air passage, and when said mask protective device is mounted on said mask surface, the mask surface comes into contact with the top of said second string-like beading so that said second groove becomes another air passage;

wherein said first curved groove is formed by applying adhesives or pressure-sensitive adhesives all around the end face at said one opening of said frame in such a manner as to form said string-like beading as at least two first string-like beads, arranged inside and outside on said end face, having respective discontinuities which are formed in different places on the end face of said frame to form openings of said first groove for allowing communication between the inside and the outside of said frame.

3. A mask protective device comprising a frame, the size of which is set to surround a mask pattern, and a transparent thin film put on said frame to close one opening of said frame, said mask protective device further comprising:

first string-like beading which is formed all around an end face at one opening of said frame by linearly applying adhesives or pressure-sensitive adhesives for bonding the periphery of said thin film to the end face; a first curved groove formed on the end face of said frame by portions of said first string-like beading facing each other in such a manner that said portions of said first string-like beading constitute the side walls of said first curved groove;

second string-like beading which is formed all around an end face at the other opening of said frame by linearly applying adhesives or pressure-sensitive adhesives for bonding said frame of said mask protective device to a mask surface; a second curved groove formed on the end face of said frame by portions of said second string-like beading facing each other in such a manner that said portions of said second string-like beading constitute the side walls of said second curved groove;

wherein each said curved groove has one opening communicating with the outside of said mask protective device and the other opening communicating with the inside of said mask protective device;

wherein when the periphery of said thin film is put on and bonded to said first string-like beading, said first groove becomes an air passage, and when said mask protective device is mounted on said mask surface, the mask surface comes into contact with the top of said second string-like beading so that said second groove becomes another air passage;

wherein said second curved groove is formed by applying adhesives or pressure-sensitive adhesives all around the end face at said other opening of said frame in such a manner as to form said string-like beading as at least two second string-like beads, arranged inside and outside on said end face, having respective discontinuities which are formed in different places on the end face of said frame to form openings of said second groove for allowing communication between the inside and the outside of said frame.

* * * * *